United States Patent
Koyama et al.

(10) Patent No.: US 6,609,295 B1
(45) Date of Patent: Aug. 26, 2003

(54) COMPONENT MOUNTING APPARATUS AND DEVICE FOR DETECTING ATTACHMENT ON COMPONENT SUBSTRATE

(75) Inventors: Toshiyuki Koyama, Yamanashi (JP); Satoshi Taniguchi, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/926,388

(22) PCT Filed: Apr. 27, 2000

(86) PCT No.: PCT/JP00/02810
§ 371 (c)(1),
(2), (4) Date: Oct. 25, 2001

(87) PCT Pub. No.: WO00/65895
PCT Pub. Date: Nov. 2, 2000

(30) Foreign Application Priority Data

Apr. 27, 1999 (JP) .......................................... 11-119762

(51) Int. Cl.⁷ .................................................. H05K 3/30
(52) U.S. Cl. ...................... 29/832; 29/566.3; 29/741; 29/739; 29/825
(58) Field of Search ...................... 29/825, 830, 832, 29/840, 833, 741, 755, 566.3, 739

(56) References Cited

U.S. PATENT DOCUMENTS

| | | | | |
|---|---|---|---|---|
| 2,867,810 A | * | 1/1959 | Gagnon | |
| 3,429,170 A | * | 2/1969 | Romeo | |
| 3,907,008 A | * | 9/1975 | Bates et al. | |
| 4,165,557 A | * | 8/1979 | Taguchi et al. | |
| 4,218,817 A | | 8/1980 | Takano | |
| 4,292,727 A | * | 10/1981 | Maxner | |
| 4,462,435 A | * | 7/1984 | Whitley | |
| 4,549,087 A | * | 10/1985 | Duncen et al. | |
| 4,570,336 A | | 2/1986 | Richter et al. | |
| 4,586,544 A | * | 5/1986 | Yagi et al. | |
| 4,627,157 A | * | 12/1986 | Campisi et al. | |
| 4,644,633 A | * | 2/1987 | Jones et al. | |
| 4,691,419 A | * | 9/1987 | Keeler et al. | |
| 4,744,141 A | * | 5/1988 | Musiani | |
| 4,814,621 A | * | 3/1989 | Soth et al. | |

FOREIGN PATENT DOCUMENTS

| | | |
|---|---|---|
| JP | 3-62998 | 3/1991 |
| JP | 4-263496 | 9/1992 |
| JP | 5-48296 | 2/1993 |
| JP | 6-216586 | 8/1994 |
| WO | 00/65895 | 11/2000 |

OTHER PUBLICATIONS

Patent Abstracts of Japan vol. 015, No. 219, published Jun. 5, 1991.
Patent Abstracts of Japan vol. 018, No. 577, published Nov. 4, 1994.
English Language Abstract of JP 4-263496.
English Language Abstract of JP 5-48296.

* cited by examiner

Primary Examiner—Carl J. Arbes
(74) Attorney, Agent, or Firm—Greenblum & Bernstein, P.L.C.

(57) ABSTRACT

A piezoelectric element is mounted to a clinch lever for detecting stress-strain generated therein when cutting and clinching leads of an electronic component that has been inserted in corresponding holes formed in a circuit board substrate. A detected voltage d is compared to a threshold voltage s selected from a plurality of threshold voltages preset in the device. When the detected voltage d exceeds the threshold voltage s, the insertion detecting section outputs a signal indicating that the insertion of the leads in the holes has been performed normally.

10 Claims, 8 Drawing Sheets

Fig. 8

| TYPE | GROUP CLASSIFICATION | | STANDARD VOLTAGE | THRESHOLD VOLTAGE |
|---|---|---|---|---|
| 001 002 003 | A | a → | I | $S_1$ |
| 004 005 006 | B | b → | II | $S_2$ |
| 007 008 009 | C | c → | III | $S_3$ |

COMPONENT MOUNTING APPARATUS AND DEVICE FOR DETECTING ATTACHMENT ON COMPONENT SUBSTRATE

TECHNICAL FIELD

The present invention relates to an apparatus for mounting electronic components with leads onto a circuit board substrate by inserting the leads of the electronic components in corresponding holes in the circuit board substrate, and further to a method and device for detecting the attachment of electronic component with leads to the circuit board substrate.

BACKGROUND ART

Mounting of an electronic component with leads onto a circuit board substrate is generally achieved by an action for fixing leads of the electronic component 20 to the circuit board 22 as shown in FIG. 9. Leads 21 of the electronic component 20 are inserted into corresponding holes 29 formed in the circuit board 22. A clinch means comprising a clinch lever 25 and a clinch bed 26 is moved to below the holes 29 in which leads 21 have been inserted. The tip of the lead 21 which has pierced through the circuit board 22 to the backside thereof is cut to a predetermined length by the clinch lever 25 moving toward the clinch bed 26. The lead 21 is clinched against and fixed to the circuit board 22 by further movement of the clinch lever 25.

A piezoelectric element 1 is attached to the clinch lever 25 for detecting stress-strain which is generated in the clinch lever 25 at the time of cutting and clinching the lead 21. From the stress-strain amount detected by the piezoelectric element 1, it is detected whether the electronic component 20 has correctly been mounted onto the circuit board 22. If the leads have not been inserted or pierced through the holes 29, or have been bent when being inserted into the holes, the clinch lever 25 accordingly receives less load. On the other hand, if the leads are properly inserted in the holes, the clinch lever 25 receives a great load upon cutting and clinching the leads, whereupon the piezoelectric element 1 detects large stress-strain. Therefore, the detected stress-strain of the clinch lever reflects the quality of the attachment of the electronic component 20 to the circuit board, and thereby it is detected whether the electronic component has been mounted in a favorable condition. For this purpose, the piezoelectric element 1 is connected to an insertion detecting circuit shown in FIG. 10.

Referring to FIG. 10, the stress-strain that is generated in the clinch lever 25 is detected by the piezoelectric element 1, and an electric signal proportional to the amount of detected stress-strain is amplified by a differential amplifier 32. A π filter 33 is provided for cutting high frequency component from the electric signal sent from the differential amplifier 32 so as to remove noise components mixed at the piezoelectric element 1. The electric signal from which noise components have been removed is amplified by a variable gain amplifier 34, so that it is compared by a voltage comparator 35 with a threshold which is a reference for judging whether the leads 21 of the electronic component 20 have properly been inserted in corresponding holes. The voltage comparator 35 is a circuit designed for comparison of an inputted voltage with a reference voltage (threshold). The threshold as the reference voltage can be preliminarily set, so that the voltage inputted from the variable gain amplifier 34 is compared therewith, and when the inputted voltage is greater than the threshold, the voltage comparator 35 changes its output voltage accordingly. With this change in voltage outputted from the voltage comparator 35 as a trigger, a monostable multivibrator 36 outputs a pulse, which is in turn inputted into the electronic component mounting apparatus from an output terminal 38 via a transistor 37. The apparatus thereby judges whether the electronic component with leads has correctly been fixed on the substrate.

There is now remarkable diversity in electronic components and component with leads is no exception. Therefore, diameter and material of the leads, and shearing stress necessary to cut the leads also come in many varieties. In the conventional insertion detecting circuit described above, however, the threshold for judgement by the voltage comparator 35 is set to a constant voltage. Upon changes to the diameter, material, or shearing stress of the leads, the stress-strain that occurs in the clinch lever 25 changes as well as the amount of stress-strain detected by the piezoelectric element 1. Accordingly, the judgement by the voltage comparator 35 was sometimes incorrect. Misjudgment also occurred in the cases such as when the clinch lever 25, clinch bed 26, or the piezoelectric element 1 was replaced, when the shape of the clinch lever 25 or clinch bed 26 varied, or when the piezoelectric element 1 having characteristics suitable for one type of apparatus was applied to a different type of apparatus.

In order to deal with such problems, it was necessary to change the preset threshold voltage in the voltage comparator 35, or to effect gain adjustment of the variable gain amplifier 34. However, such operation for changing the settings was not easy, and it is not realistic to change the settings of the circuit in accordance with changes in the stress-strain detected by the piezoelectric element 1. Not to mention, if the diameter, material, or shearing stress of leads on an identical electronic component differs, such could hardly be dealt with.

An object of the present invention is to provide a method and device capable of correctly judging whether an electronic component with leads has properly been fixed on a circuit board substrate with its leads being inserted in corresponding holes in the circuit board substrate.

DISCLOSURE OF THE INVENTION

In order to achieve the above objects, the present invention provides a method of mounting an electronic component with leads on a substrate, wherein the leads of the electronic component are inserted into corresponding holes formed in the substrate, and clinched with a clinch means so that the electronic component is fixed on the substrate, characterized by comprising the steps of:

selecting a standard reference value for determining whether or not the leads of the electronic component have been inserted in the holes, said standard reference value being selected based on values representative of characteristic features of the electronic component with leads such as diameter, material, or shearing stress of lead;

detecting stress-strain generated in said clinch means; and comparing a detected stress-strain with the selected standard reference value, whereby it is determined whether or not the electronic component with leads has been mounted to the substrate.

The apparatus for mounting an electronic component with leads on a substrate, according to the present invention, comprises an insertion head for inserting the leads of the electronic component into corresponding holes formed in the substrate, a clinch means for clinching the leads that are inserted into the corresponding holes for mounting the electronic component to the substrate, a detecting means for detecting stress-strain generated in the clinch means, and a judging means for determining whether or not the electronic component with leads has been mounted on the substrate based on a detected result obtained by the detecting means, and is characterized in that:

the judging means includes a plurality of threshold values that are preset therein, and comprises a threshold output means that is capable of selectively outputting one of these threshold values as a standard reference value for detecting the attachment of the electronic component to the substrate, a threshold selecting means for selecting one of the threshold values in accordance with the type of electronic component with leads which is to be mounted to the substrate, and an insertion detecting section which compares a detected result obtained by the detecting means with the selected threshold.

The present invention further provides a method of detecting the attachment of an electronic component with leads to a substrate, wherein the leads of the electronic component are inserted into corresponding holes formed in the substrate, and clinched with a clinch means so that the electronic component is fixed on the substrate, characterized by comprising the steps of:

selecting a standard reference value for determining whether or not the leads of the electronic component have been inserted in the holes, said standard reference value being selected based on values representative of characteristic features of the electronic component with leads;

detecting stress-strain generated in said clinch means; and comparing a detected stress-strain with the selected standard reference value, whereby it is determined whether or not the electronic component with leads has been fixedly attached to the substrate.

The device for detecting the attachment of an electronic component with leads to a substrate according to the present invention is characterized by having a threshold outputting section in which a plurality of threshold values are preset as standard reference values for judging whether the insertion of the leads to the holes has been successful or not, and which is capable of selectively outputting one of the threshold values, a threshold selecting means for selecting one of the threshold values, a detected threshold outputting section for outputting a detected value representative of the stress-strain in the clinch means, that is outputted from the detecting means, and an insertion detecting section for comparing the detected value with the selected threshold value, and for outputting an insertion detecting signal when the detected value exceeds the threshold value.

According to the present invention method and device, the standard reference value or a threshold voltage is suitably selected in accordance with differing diameters, materials, or shearing stresses of leads. A detected voltage representative of stress-strain that occurs in the clinch lever is compared with this reference value, for the judgement of whether the insertion of the leads of an electronic component into the holes in a circuit board has been successful or not. Thus the determination of the attachment of an electronic component with leads to a circuit board can correctly be performed.

BRIEF DESCRIPTION OF THE DRAWINGS

FIG. 8 is a chart showing an example of grouping types of electronic components with leads;

BEST MODE FOR CARRYING OUT THE INVENTION

Preferred embodiments of the present invention in the form of specific examples are hereinafter described with reference to the accompanying drawings. It should be noted that the embodiment shown below is one example for carrying out the present invention and does not limit the technical scope of the present invention.

First, the construction of the electronic component mounting apparatus according to the present invention will be explained with reference to FIG. 1.

Figure 1:
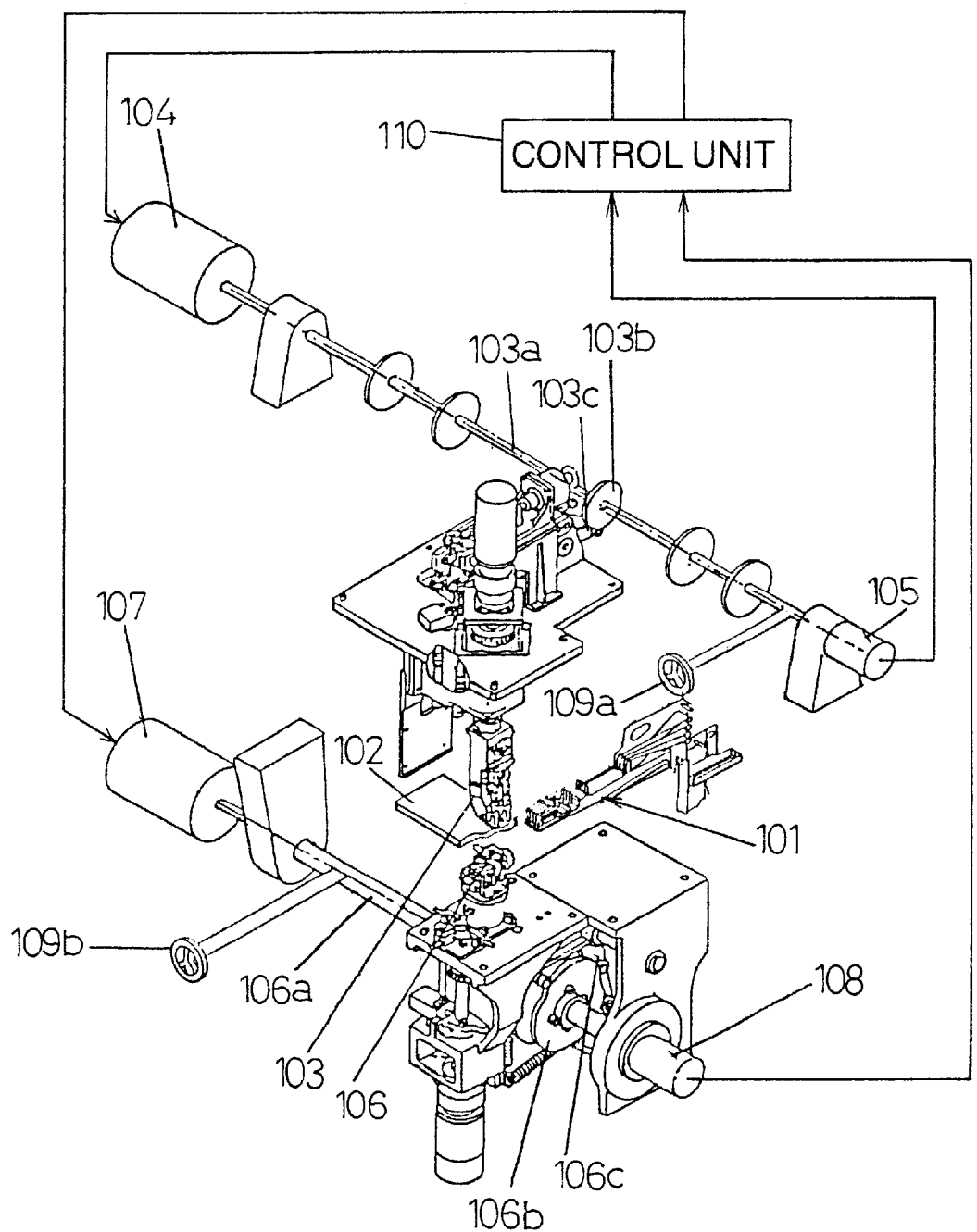
FIG. 1 is a perspective view showing major parts of an electronic component mounting apparatus.

In FIG. 1, reference numeral 101 is a parts feeder for feeding electronic components with leads in a tape-bonded state by the use of tapes. Reference numeral 102 is a circuit board on which electronic components are mounted. Reference numeral 103 is an insertion head for removing the electronic components from the parts feeder 101 and inserting the leads of the components into holes of the circuit board 102. An AC servo motor 104, a driving source for applying drive power to the insertion head 103, is connected directly to a drive shaft 103*a* of the insertion head 103. An encoder 105 is provided to the drive shaft 103*a* for detecting a rotating position of the drive shaft 103*a*. A cam 103*b*, which is part of the insertion head 103, is fixed on the drive shaft 103*a*, and a drive lever 103*c* follows the movement of the cam 103*b*, whereby the insertion head 103 is operated.

Reference numeral 106 is a fixing head arranged opposite the insertion head 103 via the circuit board 102. The fixing head 106 cuts and folds the leads of the electronic components inserted to the holes of the circuit board 102 and fixes the electronic components to the circuit board 102. An AC servo motor 107 is provided as a driving source for applying drive power to the fixing head 106. The AC servo motor 107 is directly coupled to a drive shaft 106*a* of the fixing head 106. An encoder 108 is provided to the drive shaft 106*a* for detecting a rotating position thereof. A cam 106*b* that is part of the fixing head 106 is fixed on the drive shaft 106*a*, and a drive lever 106*c* follows the movement of the cam 106*b*, whereby the fixing head 106 is operated.

Output signals from the encoder 105 of the insertion head 103 and the encoder 108 of the fixing head 106 are input to a control unit 110. The control unit 110 effects control such that the AC servo motor 104 of the insertion head 103 and the AC serve motor 107 of the fixing head 106 are driven in a synchronized fashion. Reference numeral 109*a* is a manual handle that is used for bringing the encoder 105 of the insertion head 103 to an origin of the encoder 105, and reference numeral 109*b* is a manual handle for bringing the encoder 108 of the fixing head 106 to an origin of the encoder 108.

The insertion head 103 is driven by a driving force of the AC servo motor 104 and operates such that electronic components with leads are removed from the tapes of the parts feeder 101 and mounted on the circuit board 102 with their leads inserted in corresponding holes. Simultaneously, the fixing head 106 is driven by a driving force of the AC servo motor 107 to operate so that the leads inserted in the holes formed in the circuit board 102 are cut and folded to secure the components to the circuit board 102. The insertion head 103 and fixing head 106 are respectively driven by means of the cams 103*b* and 106*b*. The cams 103*b* and 106*b* are fixed on the respective drive shafts 103*a*, 106*a*, and the rotation of AC servo motors 104, 107 that drive the drive shafts 103*a*, 106*a* is controlled in synchronism with each other by the control unit 110 on the basis of output signals from the encoders 105, 108, that are directly coupled to the AC servo motors 104, 107. The insertion head 103 and fixing device 106 thus operate synchronously. The encoders 105, 108 of the insertion head 103 and fixing head 106 are brought to their respective origins by the corresponding manual handles 109*a*, 109*b*. Driving forces are separately provided for the insertion head 103 and fixing head 106 as described above, and therefore the driving motors can be made small in size and a time required to stop and start the motors is reduced.

The operation of fixedly attaching an electronic component with leads on the circuit board 102 by the above-described component mounting apparatus will be described next with reference to FIG. 2 to FIG. 4.

Figure 2:
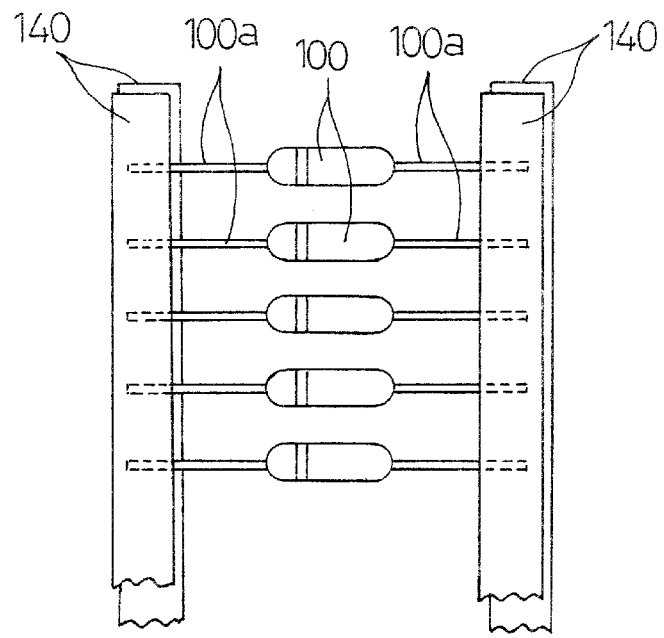
FIG. 2 is a plan view showing electronic components with leads as bonded on tapes.
Figure 3:
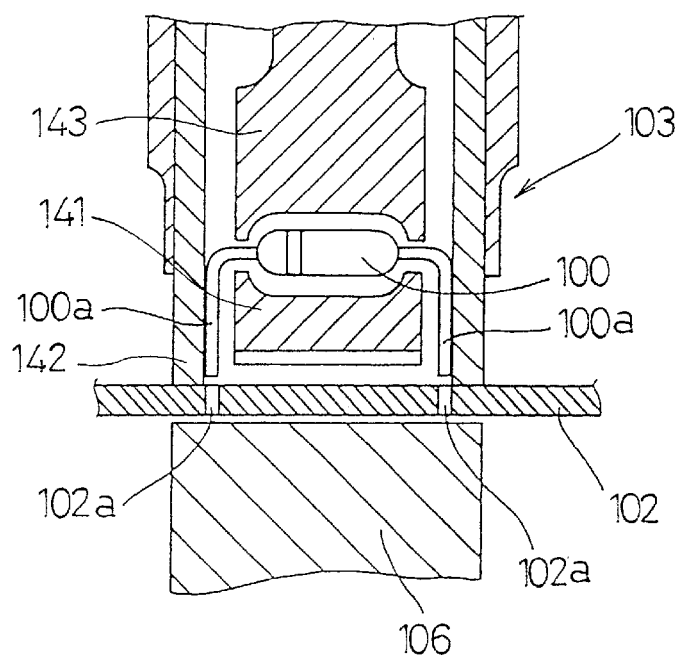
FIG. 3 is a cross-sectional view showing the structure of an insertion head of the electronic component mounting apparatus.

FIG. 2 shows an electronic component (resistor) 100 with leads 100*a* bonded on tapes 140. Components are supplied to the insertion head 103 from the parts feeder 101 in this state. The insertion head 103 comprises a pusher 143 and a receiving lever 141 that hold the electronic component 100 with leads therebetween in a sandwiched fashion. The leads 100*a* of the electronic component 100 are thus separated from the tapes 140, and folded by means of an insertion guide 142. The insertion guide 142 then comes to contact the circuit board 102, the receiving lever 141 retracts, and the pusher 143 is pushed forward so that the leads 100*a* of the electronic component 100 are inserted into corresponding holes 102*a* formed in the circuit board 102.

Figure 4A:
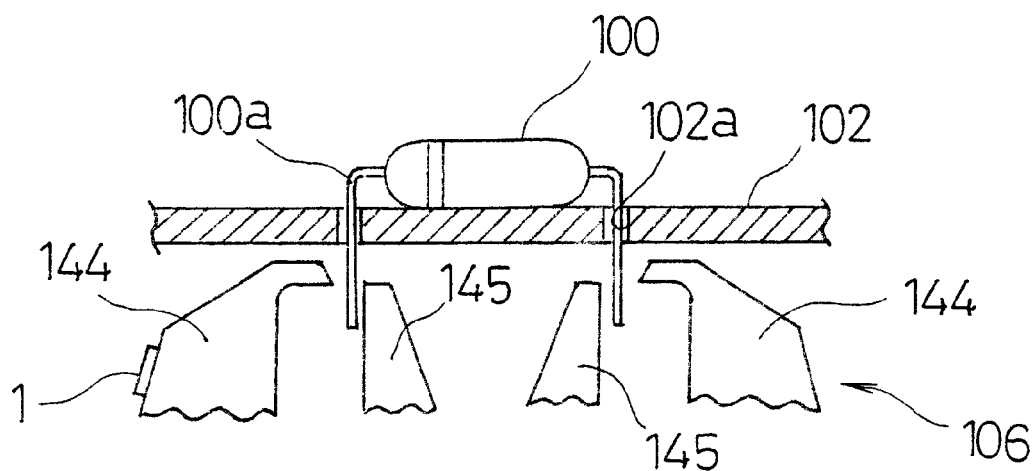
FIGS. 4A and 4B are diagrams given in explanation of how an electronic component with leads is fixed on a circuit board with a clinch means.
Figure 4B:
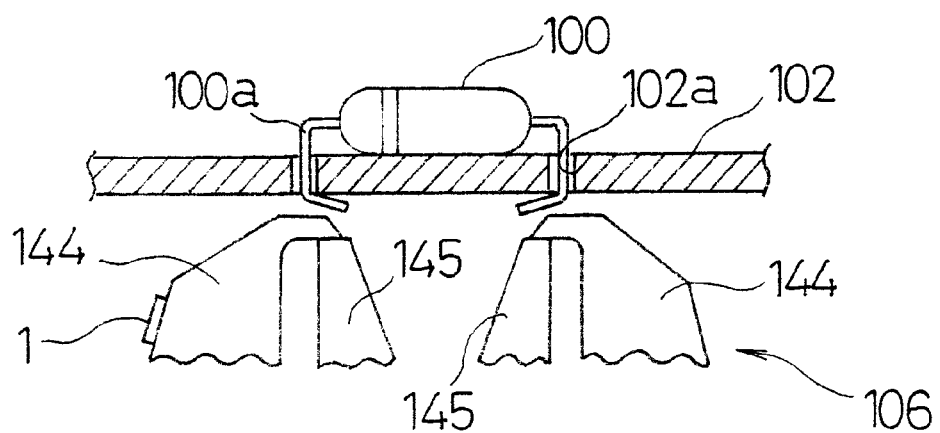

The fixing head 106 is operated in synchronism with this operation of the insertion head 103 such that the leads 100*a* that have been pierced through the holes 102*a* in the circuit board 102 are folded as shown in FIGS. 4A and 4B so as to secure the electronic component 100 on the circuit board 102. Specifically, when the leads 100*a* are inserted into the holes 102*a* as shown in FIG. 4A, a clinch means comprising a clinch lever 144 and a clinch bed 145 of the fixing head 106 is ascended. The clinch lever 144 moves toward the clinch bed 145 and thereby cuts the leads 100*a* that have pierced through the holes in the circuit board 102 to a predetermined length, and at the same time folds the leads 100*a* as shown in FIG. 4B. The electronic component 100 is thus fixedly attached on the circuit board 102.

A piezoelectric element (detecting means) 1 is mounted to the clinch lever 144 for detecting stress-strain that is generated in the clinch lever 144 when it cuts and clinches the leads 100*a*. The detected amount of strain is used for determining whether or not the electronic component 100 has been fixedly mounted on the circuit board 102.

A piezoelectric element is used as the detecting means in this embodiment, but the same effects can be achieved with other means such as a strain gauge.

Similarly to the conventional method, when the end portion of the lead 100*a* of the electronic component with leads pierced through the holes in the circuit board 102 is cut and clinched by the clinch lever 144 and clinch bed 145, the piezoelectric element 1 detects the amount of stress-strain which occurs in the clinch lever 144. The detected voltage representative of stress-strain is amplified, and is compared with a threshold voltage (standard reference value), for judging the quality of the insertion.

The insertion detecting device according to the present embodiment, however, is constructed so that the above-mentioned threshold voltage can be changed according to the characteristic features of the leads 100*a* of the electronic components such as diameter, material, or shearing stress of the leads.

As mentioned above, when the leads 100*a* of the electronic component 100 have different diameters or when they are made of different materials depending on the type of electronic component, their shearing stress varies accordingly. That is, electronic components with leads have their characteristic features in accordance with the type, and they can be represented by their characteristic values of, for example, lead diameter, lead material, or lead shearing stress. Depending on these characteristic values, the amount of stress-strain that occurs in the clinch lever 144 changes, and the amount of strain detected by the piezoelectric element 1 changes as well.

Figure 5:
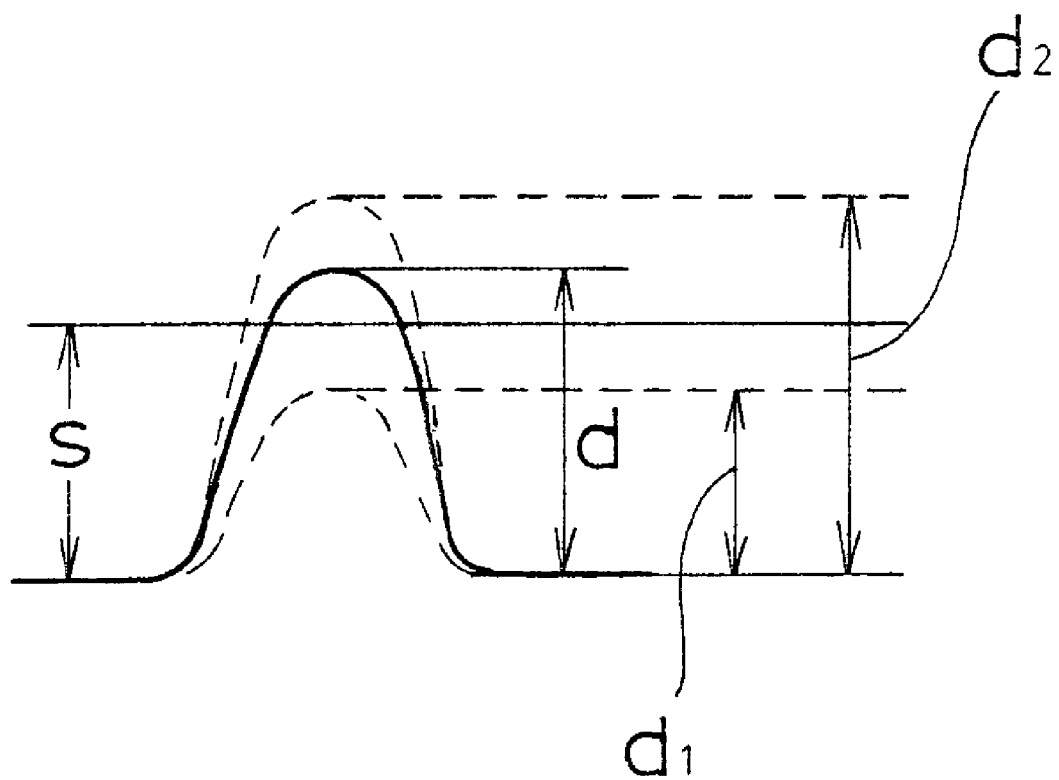
FIG. 5 is a diagram to explain the generation of erroneous operations due to changes in detected voltage.

Referring to FIG. 5, as mentioned in the foregoing, a voltage d representative of stress-strain detected by the piezoelectric element 1 is amplified and compared with a threshold voltage s, and when the detected voltage d is larger than the threshold voltage s, it is determined that the electronic component has been properly mounted on the circuit board. However, when the characteristic values of electronic component change in accordance with the type of electronic component, the detected voltage d changes as shown by the broken lines in FIG. 5. That is, if the diameter of leads 100*a* is small, or if the leads 100*a* are made of a soft material and have small shearing stress, the voltage $d_1$ representative of stress-strain detected by the piezoelectric element 1 will be smaller than the threshold voltage s as shown in FIG. 2. As a result, even though the electronic component 102 has correctly been mounted, it is judged that he attachment of the electronic component to the circuit board has been unsuccessful. On the contrary, if the diameter of leads 100*a* is large, or if the leads 100*a* are made of a hard material and have large shearing stress, the voltage $d_2$ detected by the piezoelectric element 1 will be greater than the threshold voltage s, and as a result, it is judged that the attachment of the electronic component has been successful even if the leads of the electronic component have actually been inserted in the holes in an unfavorable condition.

In the component mounting apparatus according to the present invention, a construction is provided which enables judgement whether or not the component has been mounted to be made correctly, even when electronic components 100 of various different types, having differing characteristic features of leads are dealt with.

Figure 6:
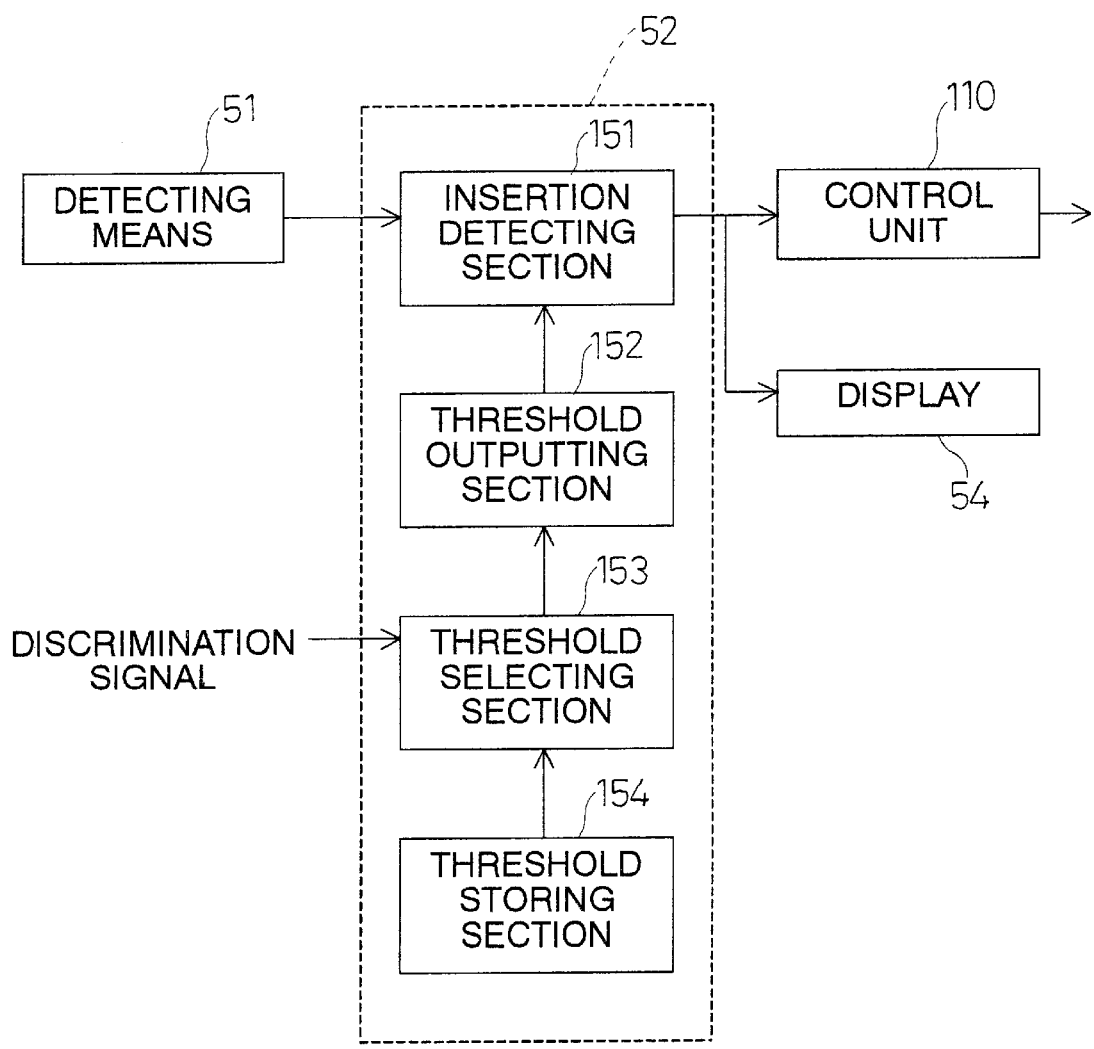
FIG. 6 is a block diagram showing the construction of the insertion detection device.

FIG. 6 is a block diagram showing one example of the construction for determining whether the attachment of the electronic component has been successful corresponding to the varying values characteristic to the electronic component 100 to be mounted. In the electronic component mounting apparatus, a mounting program is preset, in which the order of mounting electronic components in accordance with their types is determined. A controller (not shown) in the electronic component mounting apparatus outputs a discrimination signal designating the type of electronic component with leads to be mounted to a judging means 52. A plurality of thresholds for each discrete type of electronic components 100 with leads are preliminarily stored in a threshold storing section 154. Thus, a threshold selecting section 153 reads out a threshold from the threshold storing section 154, that corresponds to the type of the electronic component 100 with leads that is determined from the input discrimination signal. The threshold selected by the threshold selecting section 153 is then input to a threshold outputting section 152, which in turn inputs the threshold to an insertion detecting section 151 as a standard reference value.

Meanwhile, the electronic component mounting apparatus performs the operation for fixedly mounting the designated electronic component on the circuit board by inserting the leads into corresponding holes and clinching same. A detecting means 51, or the piezoelectric element 1 in this embodiment, detects stress-strain that is generated in the clinch lever 144, and inputs a corresponding detection signal to the insertion detecting section 151. The insertion detecting section 151 compares the detected signal with the selected reference value, and determines whether the mounting of the component on the circuit board has been successful or not. The results are outputted to the control unit 110 and to a display means 54.

If it has been judged that the mounting of the component has been performed favorably, the control unit 110 goes on to effect control for mounting a next electronic component with leads. On the other hand, if the result of judgment is unfavorable, an error sign is displayed on the display means 54, while the control unit 110 performs the operation of remounting or recovering the electronic component. For example, upon detecting an error sign, if the value measured by the detecting means is smaller than the threshold, the control unit 110 effects control over the insertion head so as to further clinch the leads, or, if there has been no signal output from the detecting means, the insertion operation of the electronic component is performed again. If an error sign is displayed, while it is confirmed visually or by some inspection method that the electronic component has actually been fixed on the substrate, this may indicate that the stress-strain generated in the clinch lever when cutting the leads of the electronic component that has been mounted was actually smaller than threshold preset in the judging means. In such a case, accordingly, the threshold may be changed in accordance with the detected voltage through some inputting means. Alternatively, the discrimination signal representative of the type of electronic component may be changed, and the judgement may be made again in accordance therewith. Further, if any failure is confirmed, the display means 54 reports it to an operator by displaying a sign indicating that maintenance is necessary.

Figure 7:
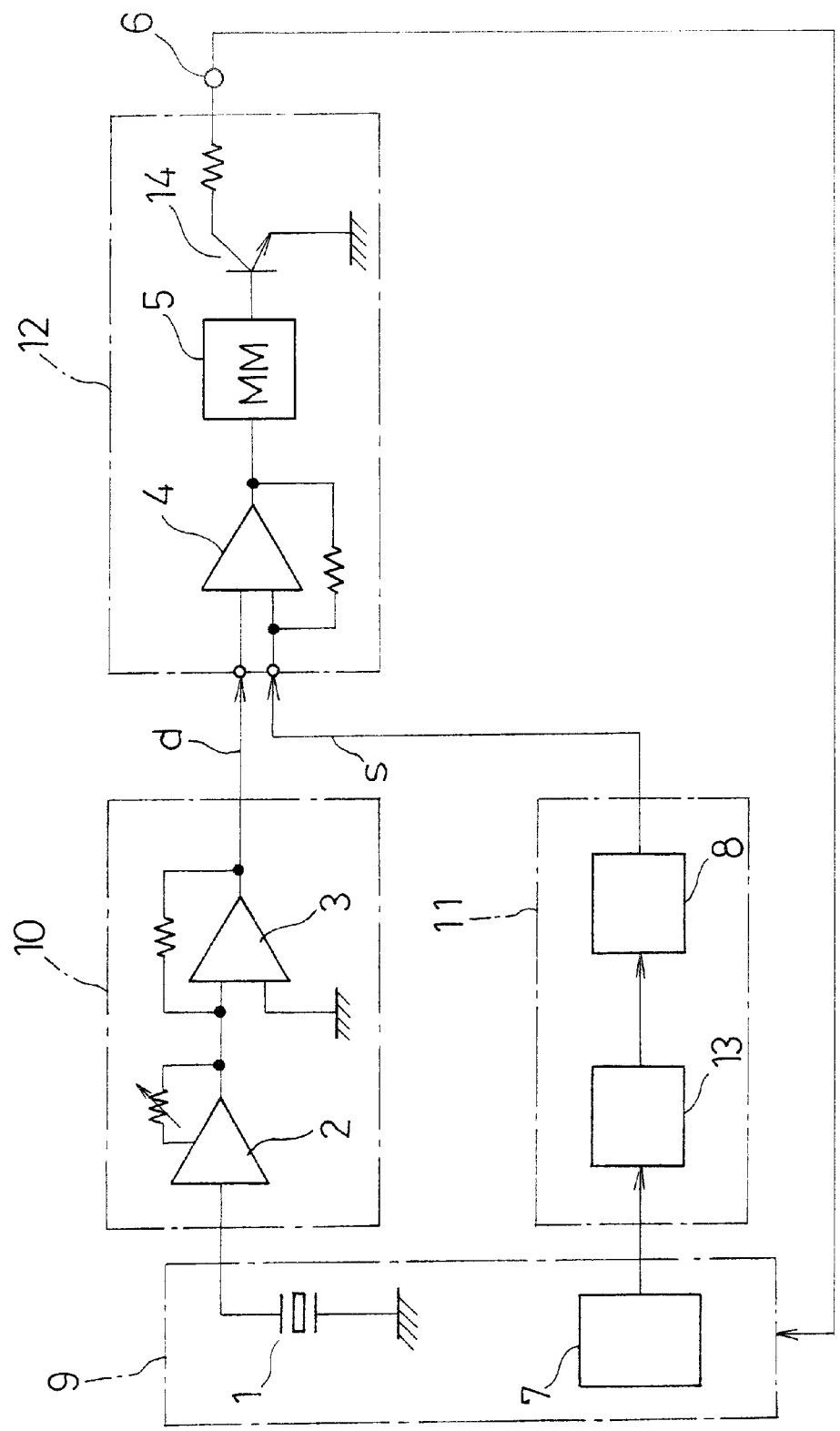
FIG. 7 is a circuit diagram showing the construction of the insertion detection device.
Figure 9:
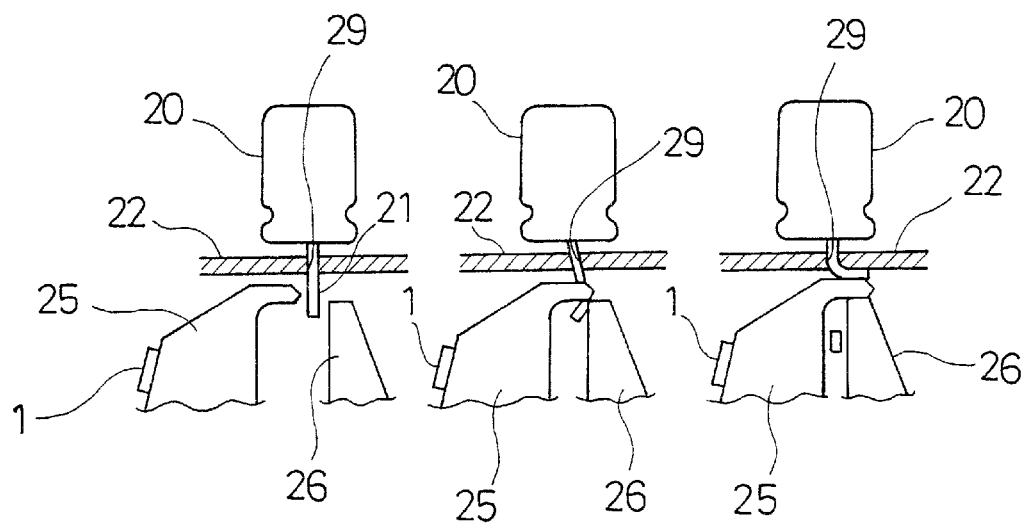
FIG. 9 is a cross sectional view for explaining the insertion operation for the electronic components with leads.
Figure 10:
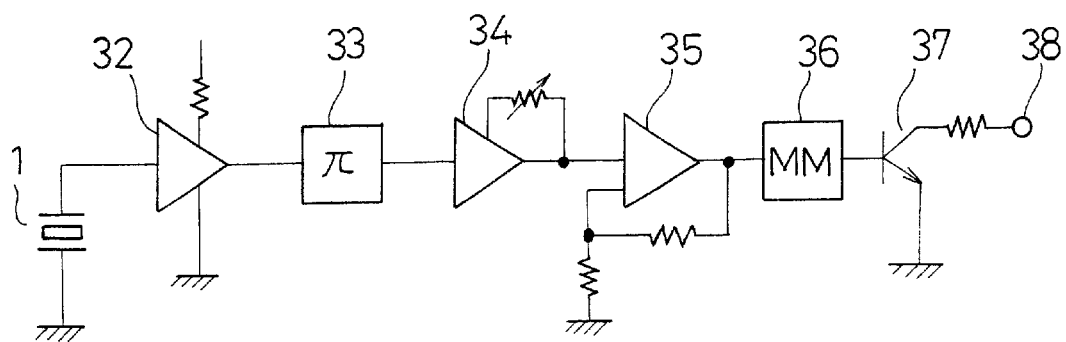
FIG. 10 is a circuit diagram showing the construction of a conventional insertion detection device.

FIG. 7 is a specific example of the circuit design for effecting such judgment as described above. In order to deal with the changes in the stress-strain in the clinch lever 144 detected by the piezoelectric element 1 due to varying characteristic features of the electronic component, the amount of strain detected by the piezoelectric element 1 is measured in advance for each type of electronic component with leads with different lead diameters, lead materials, and lead shearing stresses. These values are divided into groups of allowable ranges, based on which it is determined whether the attachment of the electronic component has been successful or not. For example, stress-strain in the clinch lever when cutting and clinching leads is measured preliminarily with respect to the leads of every type of electronic components that are to be mounted. Referring to FIG. 8, if the leads of types 001~003 of electronic components 100 have a stress-strain that is within a prescribed range, these are placed in group A. Likewise, types 004~006 of electronic components 100 with leads 100$a$ are placed in group B and types 007~009 of electronic components with leads are placed in group C in accordance with the extent of stress-strain in the clinch lever. The data for such groups corresponding to types of electronic components with leads are stored in the aforementioned threshold storing section 154 in the form of a data table 7. Reference numeral 9 in FIG. 7 represents the electronic component mounting apparatus, and the data table 7 is stored, for example, within a controller (not shown) of the electronic component mounting apparatus 9.

In the electronic component mounting apparatus 9, a mounting program is preset, in which the order of electronic components to be mounted is determined and the types of electronic components are successively designated in this order. Accordingly, the controller of the electronic component mounting apparatus 9 outputs a signal designating the types of electronic components to be mounted to the data table 7. The data table 7 outputs the group discrimination signals a~c, corresponding to the input types of electronic components, to the threshold voltage outputting section 11.

The clinch lever 144 operates with the insertion of leads of the electronic components 100 into corresponding holes, and the stress-strain generated in the clinch lever 144 is detected by the piezoelectric element 1. An electrical signal corresponding to the detected amount of strain is output to the detected voltage outputting section 10. The detected voltage outputting section 10 amplifies the input electrical signal with a variable gain amplifier 2. Since this electrical signal includes a noise component due to the piezoelectric element picking up vibration generated from the operation of the electronic component mounting apparatus 9, the high frequency component in the electrical signal, that is the noise component, is removed by passage through an active low-pass filter 3. The signal is then output as the detected voltage d to the insertion detecting section 12. The amplification factor of the variable gain amplifier 2 is adjustable and therefore the variable gain amplifier can adjust the voltage level of the detected voltage 2. The active low-pass filter 3 can be made to correspond to acceleration of the tact time for insertion by the electronic component mounting apparatus 9 with good response.

The threshold voltage outputting section 11, to which the discrimination signal is input, switches the standard reference voltage to a value corresponding to the discrimination signal by means of a standard voltage switcher 13. The standard voltage switcher 13 has the function of switching the standard voltage to a voltage I, II, III corresponding to the discrimination signals a, b, and c of the groups A, B, and C as shown in FIG. 8. For example, when the discrimination signal a is input to the standard voltage switcher 13, the standard voltage I is output to a threshold voltage outputter 8. The threshold voltage outputter 8 outputs the input standard voltage I as the threshold voltage $s_1$ to the insertion detecting section 12.

The insertion detecting section 12 compares the input detected voltage d to the threshold voltage $s_1$ with a voltage comparator 4. When the detected voltage d exceeds the threshold voltage $s_1$, the voltage level of the output terminal is inverted. With this inversion of the voltage level as the trigger, a monostable multivibrator 5 outputs a rectangular wave. The rectangular wave is output through an output transistor 14 from an output terminal 6. The output signal from this output terminal 6 is input to the electronic component mounting apparatus 9, and the electronic component mounting apparatus 9 determines that the attachment operation for the electronic component with leads was performed normally when there is an output signal. On the contrary, when there is no output signal even though the insertion operation was performed, the attachment operation is judged to have not been normal and the electronic component mounting apparatus indicates an insertion error and calls for recovery insertion or maintenance.

In this way, the threshold voltages $S_1 \sim S_3$ are changed corresponding to the lead diameter, lead material, or lead shearing stress, and therefore, no errors occur in the judgement of whether the insertion was good or bad, even when various types of electronic components with leads wherein the leads 100a have differing diameters, materials, or shearing stresses are inserted into the holes in a single circuit board 102.

In the embodiment described above, the threshold voltage for insertion detection is established based on values representative of characteristic features of the leads of electronic components such as diameter, material, or shearing stress of lead. However, stress-strain also changes when the design form of the clinch lever 144 is changed. Moreover, when the type of piezoelectric element 1 is changed, the stress-strain will also change depending on the change in its properties. Such changes in the detected voltage can also be dealt with by the present invention method by altering the voltage level of the standard voltage switcher 13 as described above.

Further, the piezoelectric element 1 may be mounted on the clinch bed 145 instead of the clinch lever 144 as in the above described embodiment. The attachment of the electronic components 100 on the circuit board can be similarly judged from the stress-strain generated in the clinch bed 145. Although, in this embodiment, the piezoelectric element 1 as the detecting means is provided to one of the pair of clinch means provided for a pair of leads of an electronic component, but the detecting means can of course be provided to both of the pair of clinch levers. In this case, detection results of both of the detecting means may separately be provided for the judgement of whether the component has properly been attached to the substrate, and the standard reference values may individually set for each of the detecting means. Alternatively, the judgement may be made based on means value of the results obtained by the two detecting means.

Furthermore, an input device with which the user can select any threshold voltage can be provided as means for selecting one of a plurality of threshold voltages output from the threshold voltage outputting section 11.

Furthermore, in the embodiment described above, the case of detecting the attachment of electronic component on substrate has been described by way of example, but the present invention method and device can also favorably be utilized for detecting the incision of the leads by presetting a plurality of standard reference values in a similar manner. Or, of course, the present invention method and device can be used for detecting both of the attachment of electronic component on substrate and the incision of the leads.

INDUSTRIAL APPLICABILITY

With the present invention method and device, as described above, the reference voltage value for detecting the attachment of an electronic component to a substrate can be altered in accordance with changes in the voltage representative of stress-strain in the clinch lever. Therefore, the present invention can favorably be applied to the fields of electronic component mounting techniques wherein components with leads are mounted on a substrate with their leads being inserted in corresponding holes.

What is claimed is:

1. A method of mounting an electronic component with leads on a substrate, wherein the leads of the electronic component are inserted into corresponding holes formed in the substrate, and clinched with a clinch means so that the electronic component is fixed on the substrate, comprising the steps of:

selecting a standard reference value for determining whether or not the leads of the electronic component have been inserted in the holes, said standard reference value being selected based on values representative of characteristic features of the electronic component with leads such as diameter, material, or shearing stress of lead;

detecting stress-strain generated in said clinch means; and comparing a detected stress-strain with the selected standard reference value, whereby it is determined whether or not the electronic component with leads has been mounted to the substrate.

2. An apparatus for mounting an electronic component with leads on a substrate, comprising an insertion head for inserting the leads of the electronic component into corresponding holes formed in the substrate, a clinch means for clinching the leads that are inserted into the corresponding holes for mounting the electronic component to the substrate, a detecting means for detecting stress-strain generated in the clinch means, and a judging means for determining whether or not the electronic component with leads has been mounted on the substrate based on a detected result obtained by the detecting means, wherein:

the judging means includes a plurality of threshold values that are preset therein, and comprises a threshold output means that is capable of selectively outputting one of these threshold values as a standard reference value for detecting the attachment of the electronic component to the substrate, a threshold selecting means for selecting one of the threshold values in accordance with the type of electronic component with leads which is to be mounted to the substrate, and an insertion detecting section which compares a detected result obtained by the detecting means with the selected threshold.

3. A method of detecting the attachment of an electronic component with leads to a substrate, wherein the leads of the electronic component are inserted into corresponding holes formed in the substrate, and clinched with a clinch means so that the electronic component is fixed on the substrate, comprising the steps of:

selecting a standard reference value for determining whether or not the leads of the electronic component have been inserted in the holes, said standard reference value being selected based on values representative of characteristic features of the electronic component with leads; detecting stress-strain generated in said clinch means; and comparing a detected stress-strain with the selected standard reference value, whereby it is determined whether or not the electronic component with leads has been fixedly attached to the substrate.

4. The method according to claim 3 wherein the plurality of standard reference values are preset in accordance with diameters, materials or shearing stress of the leads of the electronic components to be mounted on the substrate.

5. A device for detecting the attachment of an electronic component with leads to a substrate, wherein the leads of the electronic component are inserted in corresponding holes formed in the substrate, and stress-strain generated in a clinch means is detected by a detecting means attached to the clinch means, including

- a threshold storing section in which a plurality of threshold values are preset as standard reference values for judging whether the insertion of the leads to the holes has been successful or not, and which is capable of selectively outputting one of the threshold values,
- a threshold selecting means for selecting one of the threshold values,
- a detected threshold outputting section for outputting a detected value representative of the stress-strain in the clinch means, that is outputted from the detecting means, and
- an insertion detecting section for comparing the detected value with the selected threshold value, and for outputting an insertion detecting signal when the detected value exceeds the threshold value.

6. The device according to claim 5, wherein the detecting means comprises a piezoelectric element, and outputs a voltage representative of stress-strain in the clinch means.

7. The device according to claim 5, wherein the threshold selecting means is an inputting device with which a user can arbitrarily select a threshold value.

8. The device according to claim 5, wherein the threshold selecting means consists in a data table stored in the device, the data table containing data of a plurality of groups of various different types of electronic components classified in accordance with the characteristic features of their leads, and upon obtaining a signal representative of the type of electronic component to be attached to the substrate, the threshold selecting means determines a group to which said electronic component belongs and outputs a discrimination signal representative of the determined group, and in response thereto, the threshold outputting section outputs a threshold value which corresponds to the discrimination signal.

9. The device according to claim 5, wherein the threshold values can be changed in accordance with changes in the shape of the clinch means.

10. The device according to claim 5, wherein the threshold values can be changed in accordance with changes in the characteristic features of the detecting means.

* * * * *

UNITED STATES PATENT AND TRADEMARK OFFICE
CERTIFICATE OF CORRECTION

PATENT NO. : 6,609,295 B1
DATED : August 26, 2003
INVENTOR(S) : T. Koyama et al.

It is certified that error appears in the above-identified patent and that said Letters Patent is hereby corrected as shown below:

Title page,
Item [54], Title, "COMPONENT MOUNTING APPARATUS AND DEVICE FOR DETECTING ATTACHMENT ON COMPONENT SUBSTRATE" should be
-- COMPONENT MOUNTING APPARATUS AND DEVICE FOR DETECTING ATTACHMENT OF COMPONENT ON SUBSTRATE --.

Signed and Sealed this

Twenty-ninth Day of June, 2004

JON W. DUDAS
*Acting Director of the United States Patent and Trademark Office*